United States Patent
Miyagi

(10) Patent No.: US 7,920,835 B2
(45) Date of Patent: Apr. 5, 2011

(54) FM TRANSMITTER

(75) Inventor: Hiroshi Miyagi, Tokyo (JP)

(73) Assignee: Ricoh Company, Ltd., Ohta-Ku, Tokyo (JP)

(*) Notice: Subject to any disclaimer, the term of this patent is extended or adjusted under 35 U.S.C. 154(b) by 1277 days.

(21) Appl. No.: 11/460,968

(22) Filed: Jul. 28, 2006

(65) Prior Publication Data

US 2007/0071246 A1    Mar. 29, 2007

(30) Foreign Application Priority Data

Sep. 28, 2005  (JP) ................................ 2005-282774

(51) Int. Cl.
*H04B 1/06* (2006.01)

(52) U.S. Cl. ........................................ 455/112; 455/118

(58) Field of Classification Search ............... 455/91, 455/95, 108, 110, 112, 113, 118, 119, 120; 381/3, 15, 16

See application file for complete search history.

(56) References Cited

U.S. PATENT DOCUMENTS

| | | | |
|---|---|---|---|
| 5,995,552 A | 11/1999 | Moriyama | |
| 6,564,040 B1 | 5/2003 | Fujiwara | |
| 2006/0019616 A1* | 1/2006 | Abe et al. | 455/113 |
| 2007/0195961 A1* | 8/2007 | Komori | 381/3 |

FOREIGN PATENT DOCUMENTS

| | | | |
|---|---|---|---|
| JP | 08-065105 A | 3/1996 |
| JP | 08-307291 A | 11/1996 |
| JP | 09-321720 | 12/1997 |
| JP | 2000-228635 | 8/2000 |
| JP | 2000-341165 | 12/2000 |

* cited by examiner

*Primary Examiner* — Thanh C Le
(74) *Attorney, Agent, or Firm* — patenttm.us

(57) ABSTRACT

An FM transmitter with improved degree of freedom in parts selection comprises: an oscillator connected with a crystal oscillator; a clock generating circuit uses a signal formed by frequency-dividing an oscillator output as a reference frequency, and which generates a clock having a frequency of an integer multiple of the frequency of the reference frequency; a DSP operates synchronously with the clock performing stereo modulation processing, FM modulation processing, and IQ modulation processing to inputted stereo data by digital processing; a frequency synthesizer generates a reference having a frequency an integer multiple of the frequency of the reference; mixers which mix signals outputted from the DSP with signals generated by the frequency synthesizer, respectively; an adder which adds outputs of the mixers; and an amplifier which amplifies an output signal of the adder and transmits the amplified signal from an antenna.

25 Claims, 5 Drawing Sheets

FM TRANSMITTER

BACKGROUND OF THE INVENTION

1. Field of the Invention

The present invention relates to an FM transmitter which converts an audio stereo signal and the like to an FM signal, and transmits the FM signal.

2. Description of the Related Art

Conventionally, there is known an FM transmitter which is capable of converting an audio stereo signal to an FM signal and transmitting the FM signal, so as to enable an FM receiver arranged in the vicinity of the FM transmitter to output a sound (for example, Japanese Patent Laid-Open No. 2000-228635). In this FM transmitter, the oscillation frequency of a crystal oscillator is set to an integer multiple or an integer fraction of 7.6 MHz, and the oscillation signal of the oscillation frequency is frequency-divided to generate a signal of 38 kHz required for FM modulation processing and a reference frequency signal of 50 kHz required for a PLL circuit for outputting an FM broadcast wave. Such an arrangement, in which the oscillation signal of a single crystal oscillator is frequency-divided to generate two kinds of signals, makes it possible to simplify a constitution in comparison with a prior FM transmitter provided with two crystal oscillators.

However, in the above described FM transmitter, the oscillation frequency of the crystal oscillator is extremely limited because of the need to generate the signals of 38 kHz and 50 kHz by dividing the oscillation signal, which results in a problem that the degree of freedom in parts selection is low.

SUMMARY OF THE INVENTION

The present invention has been made in view of the above described circumstances. An object of the present invention is to provide an FM transmitter in which the degree of freedom in parts selection is improved.

In order to solve the above-described problem, according to the present invention, there is provided an FM transmitter comprising: an oscillator connected with a crystal oscillator; a clock generating circuit which generates a clock signal synchronized with a signal formed by frequency-dividing an output signal of the oscillator; a digital signal processor to which the clock signal generated by the clock generating circuit is inputted as an operating clock, and which performs a stereo modulating operation to stereo data by digital processing; and a carrier wave generating circuit to which a signal formed by frequency-dividing the output signal of the oscillator is inputted, and which generates a carrier wave synchronized to the inputted signal and having a frequency of an integer multiple of the frequency of the inputted signal, the FM transmitter transmitting an FM modulation signal formed by frequency-modulating a stereo composite signal obtained by the stereo modulating operation performed by the digital signal processor.

Further, according to the present invention, there is provided an FM transmitter comprising: an oscillator connected with a crystal oscillator; a clock generating circuit which generates a clock signal synchronized with a signal formed by frequency-dividing an output signal of the oscillator; a digital signal processor to which the clock signal generated by the clock generating circuit is inputted as an operating clock, and which performs a stereo modulating operation to stereo data by digital processing; and a carrier wave generating circuit to which the output signal of the oscillator is directly inputted, and which generates a carrier wave synchronized to the output signal and having a frequency of an integer multiple of the frequency of the output signal, the FM transmitter transmitting an FM modulation signal formed by frequency-modulating a stereo composite signal obtained by the stereo modulating operation performed by the digital signal processor.

Further, according to the present invention, there is provided an FM transmitter comprising: an oscillator connected with a crystal oscillator; a clock generating circuit which generates a clock signal synchronized with an output of the oscillator; a digital signal processor to which the clock signal generated by the clock generating circuit is inputted as an operating clock, and which performs a stereo modulating operation to stereo data by digital processing; and a carrier wave generating circuit to which a signal formed by frequency-dividing the output signal of the oscillator is inputted, and which generates a carrier wave synchronized to the inputted signal and having a frequency of an integer multiple of the frequency of the inputted signal, the FM transmitter transmitting an FM modulation signal formed by frequency-modulating a stereo composite signal obtained by the stereo modulating operation performed by the digital signal processor.

Further, it is preferred that respective functions of the oscillator except the crystal oscillator, the clock generating circuit, the digital signal processor, and the carrier wave generating circuit, as described above, are integrally formed on a single semiconductor substrate by using a semiconductor process. By integrally forming the respective functions of all the components except the crystal oscillator as one chip component by a semiconductor process, it is possible to attain the size reduction, the facilitation of manufacture, the reduction in power consumption, and the like, in the FM transmitter. In particular, these effects are made more remarkable by adopting a CMOS process as the semiconductor process.

Further, the above described clock generating circuit is preferably a first PLL circuit to which the output signal of the oscillator is inputted as a first reference frequency signal fr1 directly or after being frequency-divided, and which generates a clock signal having a frequency of m-fold of the frequency of the first reference frequency signal fr1, when a division ratio of a first frequency divider included in the first PLL circuit is set to an integer m. Further, the above described carrier wave generating circuit is preferably a second PLL circuit to which the output signal of the oscillator is inputted as a second reference frequency signal fr2 directly or after being frequency-divided, and which generates a carrier wave having a frequency of n-fold of the frequency of the second reference frequency signal fr2, when a division ratio of a second frequency divider included in the second PLL circuit is set to an integer n.

The stereo modulation processing can be realized by using a digital signal processor, i.e., a so-called DSP, without actually generating a subcarrier signal of 38 kHz and a pilot signal of 19 kHz. This eliminates the need to use a crystal oscillator having a natural oscillation frequency of an integer multiple of 19 kHz and 38 kHz, thereby enabling the degree of freedom in parts selection to be improved.

Further, it is preferred that the above described second PLL circuit is a frequency synthesizer in which the division ratio n of the second frequency divider can be changed, and that a control section is further provided, which is capable of changing the division ratio n thereby variably sets the frequency of the output signal of the second PLL circuit at an assigned frequency interval of FM broadcast waves or at an integer fraction of the assigned frequency interval. This makes it possible to transmit an FM modulation signal which can be received by a general FM receiver for receiving FM broadcast waves. Further, the frequency of the FM modulation signal can be switched at the assigned frequency interval of FM broadcast waves, so that it is possible to easily select a free frequency at which an FM broadcast wave is not received by the FM receiver.

Further, the above described carrier wave generating circuit preferably outputs, as a carrier wave, a signal formed by frequency-dividing a signal generated by the second PLL circuit with a third frequency divider having a division ratio L. Specifically, it is preferred that the above described second PLL circuit is a frequency synthesizer in which the division ration of the second frequency divider can be changed, and that a control section is further provided, which is capable of changing the division ratio n thereby variably sets the frequency of the output signal of the second PLL circuit at an assigned frequency interval of FM broadcast waves or at an frequency interval obtained by multiplying the interval of an integer fraction of the assigned frequency interval by the division ratio L of the third frequency divider. This makes it possible to extend the frequency interval of the output signal of the second PLL circuit, when the frequency interval of the carrier waves that can be generated is set to be constant. As a result, it is possible to further relax the frequency condition of the crystal oscillator used to generate the second reference frequency signal fr2 inputted to the second PLL circuit.

Further, it is preferred that the frequency of the above described second reference frequency signal fr2 is not coincident with the assigned frequency interval of FM broadcast waves or with an integer fraction of the assigned frequency interval. This makes it possible to further relax the frequency condition required of the second reference frequency signal fr2, i.e., the frequency condition required of a crystal oscillator that can be used, and to thereby improve the degree of freedom in parts selection.

Further, it is preferred that the frequency of the above described second reference frequency signal fr2 is not coincident with the assigned frequency interval of FM broadcast waves or with an integer fraction of the assigned frequency interval, and is not coincident with an integer multiple of 19 kHz. Alternatively, it is preferred that the frequency of the above described second reference frequency signal fr2 is not coincident with the assigned frequency interval of FM broadcast waves or with a frequency obtained by multiplying an integer fraction of the assigned frequency interval by the division ratio L of the third frequency divider, and is not coincident with an integer multiple of 19 kHz. The stereo modulation processing by digital processing performed by the digital signal processor eliminates the need of generating a signal of an integer multiple of 19 kHz. This makes it possible to further relax the frequency condition required of a crystal oscillator that can be used, and to thereby improve the degree of freedom in parts selection.

Further, the above described crystal oscillator preferably has a natural oscillation frequency of 32.768 kHz. This makes it possible to use a crystal oscillator which is commercially available for clocks at low cost, and to thereby reduce component costs.

Further, it is preferred that the frequency of the above described second reference frequency signal fr2 is coincident with the assigned frequency interval of FM broadcast waves or with an integer fraction of the assigned frequency interval. Alternatively, it is preferred that the frequency of the above described second reference frequency signal fr2 is coincident with the assigned frequency interval of FM broadcast waves or with a frequency obtained by multiplying an integer fraction of the assigned frequency interval by the division ratio L of the third frequency divider. This makes it possible to generate and transmit an FM modulation signal without a frequency error at a frequency that can be received by the FM receiver, and thereby to improve the reception quality at the time when the FM modulation signal is received by the FM receiver.

Further, it is preferred that the above described digital signal processor performs an FM modulating operation to the stereo composite signal obtained by the stereo modulating operation, and performs an IQ modulating operation which extracts an I component and a Q component of a signal subjected to the FM modulating operation. Specifically, it is preferred that the above described carrier wave generating circuit generates two kinds of carrier waves which are 90° out of phase from each other, and that a transmission circuit is further provided, the transmission circuit having: two mixers which independently mixes signals, each corresponding to each of the I component and the Q component that are extracted by the digital signal processor, with two kinds of carrier waves generated by the carrier wave generating circuit, respectively; an adder which adds the two kinds of signals mixed by the two mixers; and an amplifier which amplifies an output of the adder and transmits the amplified signal from an antenna. By adopting the IQ modulation system, it is possible to reduce the image included in the FM transmission signal.

Further, the above described second PLL circuit is preferably provided with an oscillator whose oscillation frequency is changed in accordance with an amplitude of the stereo composite signal obtained by the stereo modulating operation performed by the digital signal processor. By adopting a so-called direct modulation system capable of changing the carrier wave frequency, it is possible to transmit an FM modulation signal with a simple constitution.

Further, an external circuit may be connected instead of the above described oscillator connected with the crystal oscillator, so as to enable a signal supplied from the external circuit to be used instead of the output signal of the oscillator connected with the crystal oscillator. In such a case where an FM transmitter and the other devices such as an FM receiver are respectively formed as a single chip component, the use of a signal generated by apart (external circuit) of the other devices such as the FM receiver makes it possible to eliminate the oscillator and the crystal oscillator which are exclusively used for the FM transmitter, to thereby simplify the constitution.

DETAILED DESCRIPTION OF THE PREFERRED EMBODIMENTS

Figure 1:
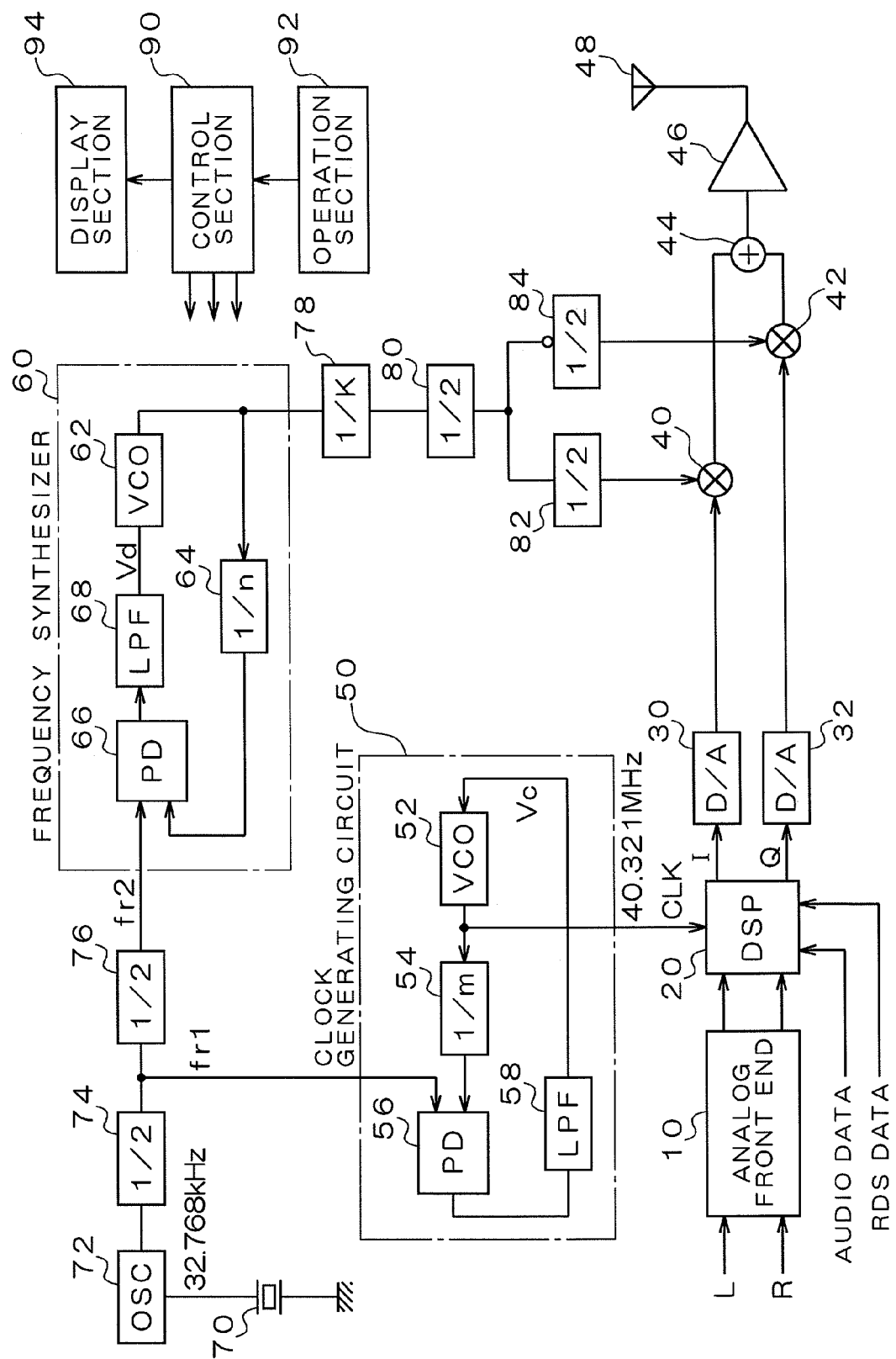
FIG. 1 is a figure showing a constitution of an FM transmitter according to an embodiment of the present invention.

In the following, an FM transmitter according to an embodiment of the present invention will be described in detail. FIG. 1 is a figure showing a constitution of an FM transmitter according to an embodiment of the present invention. As shown in FIG. 1, the FM transmitter according to the present embodiment is provided with an analog front end (analog FE) 10, a DSP (digital signal processor) 20, digital-analog converters (D/As) 30 and 32, mixers 40 and 42, an adder 44, an amplifier 46, an antenna 48, a clock generating circuit 50, a frequency synthesizer 60, a crystal oscillator 70, an oscillator (OSC) 72, frequency dividers 74, 76, 78, 80, 82, and 84, a control section 90, an operation section 92, and a display section 94.

Figure 2:
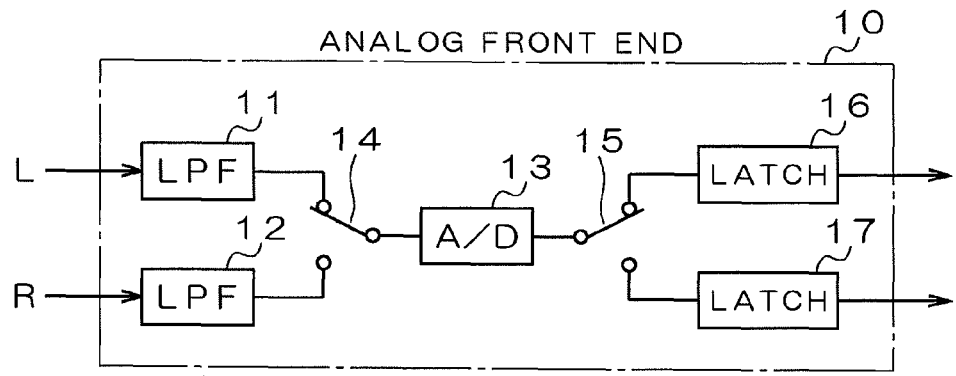
FIG. 2 is a figure showing a detailed constitution of an analog front end.

The analog front end 10, to which an analog stereo signal consisting of an L signal and an R signal are inputted, converts the signal into L data and R data as digital stereo data. FIG. 2 is a figure showing a detailed constitution of the analog front end 10. As shown in FIG. 2, the analog front end 10 is provided with low pass filters (LPFS) 11 and 12, an analog-digital converter (A/D) 13, switches 14 and 15, and latches 16 and 17. The analog L signal is made to pass through the low pass filter 11, and thereafter, is inputted into the analog-digital converter 13 via the switch 14. Similarly, the analog R signal is made to pass through the low pass filter 12, and thereafter, is inputted into the analog-digital converter 13 via the switch 14. The analog-digital converter 13 samples each of the L signal and the R signal, which are inputted, in a predetermined sampling frequency fs, and generates digital L data and digital R data. The L data generated by the analog-digital converter 13 is held in the latch 16 via the switch 15. The R data generated by the analog-digital converter 13 is also held in the latch 17 via the switch 15. The two switches 14 and 15 are used to synchronously switch the input/output lines of the analog-digital converter 13, and switch the connection destinations at a frequency 2 fs which is twice the above described sampling frequency fs. When the low pass filter 11 into which the L signal is inputted, and the analog-digital converter 13 are connected by the switch 14, the analog-digital converter 13 and the latch 16 for holding L data are connected with each other by the switch 15. On the other hand, when the low pass filter 12 into which the R signal is inputted, and the analog-digital converter 13 are connected by the switch 14, the analog-digital converter 13 and the latch 17 for holding R data are connected with each other by the switch 15. The L data and the R data which are respectively held in the latches 16 and 17 are outputted to the DSP 20 at the subsequent stage.

Note that in the above described analog front end 10, the analog-digital conversion processing is performed to the L signal and the R signal by using a single analog-digital converter 13, but the analog front end 10 may be provided with two analog-digital converters for these two kinds of signals so as to independently perform the analog-digital conversion processing to these two kinds of signals.

The DSP 20 performs stereo modulation processing, FM modulation processing, and IQ modulation processing by digital processing on the basis of the L data and the R data which are outputted from the analog front end 10. Further, audio data and RDS data are inputted to the DSP 20, so that the above described various kinds of processing can also be performed to these data. From the DSP 20, I data and Q data after being subjected to the IQ modulation processing are outputted. The details of the DSP 20 will be described below.

The digital-analog converter 30 converts the I data outputted from the DSP 20 into an analog I signal. Also, the digital-analog converter 32 converts the Q data outputted from the DSP 20 into an analog Q signal. The mixer 40 mixes the I signal outputted from the digital-analog converter 30 with a predetermined local oscillation signal (hereinafter referred to as a first local oscillation signal), and outputs the mixed signal. The mixer 42 mixes the Q signal outputted from the digital-analog converter 32 with a local oscillation signal (hereinafter referred to as a second local oscillation signal) which is 90° out of phase from the first local oscillation signal, and outputs the mixed signal. The adder 44 composes the signals outputted from the two mixers 40 and 42, and outputs the composed signal. The output (FM modulation signal) of the adder 44 is power-amplified by the amplifier 46, and then transmitted from the antenna 48.

The clock generating circuit 50 generates an operating clock signal CLK required for the digital processing performed by the DSP 20. For example, the clock generating circuit 50, to which the reference frequency signal fr1 of 16.384 kHz is inputted, generates a clock signal CLK which is synchronized with the reference frequency signal, and which has a frequency (40.321 MHz) formed by multiplying the reference frequency by 2461. To this end, the clock generating circuit 50 is provided with a voltage controlled oscillator (VCO) 52, a frequency divider (1/m) 54, a phase comparator (PD) 56, and a low pass filter (LPF) 58. The voltage controlled oscillator 52 performs an oscillation operation at a frequency corresponding to a control voltage Vc. The frequency divider 54 frequency-divides the output signal of the voltage controlled oscillator 52 by a fixed division ratio m (=2461), and outputs the divided signal. The phase comparator 56 compares the phase of the divided signal outputted from the frequency divider 54 with the phase of the reference frequency signal fr1, and outputs a pulse signal having a phase lead or a phase lag corresponding to the phase difference. The low pass filter 58 smoothes the pulse signal outputted from the phase comparator 56, so as to generate the control voltage Vc which is supplied to the voltage controlled oscillator 52. In this way, the clock generating circuit 50 has a PLL constitution (first PLL circuit), and generates a clock signal CLK having a frequency (40.321 MHz) 2461 times the frequency of the reference frequency signal fr1, so as to input the generated clock signal to the DSP 20.

The frequency synthesizer 60 generates an oscillation signal required to generate the first and second local oscillation signals which are inputted into the mixers 40 and 42, respectively. For example, the frequency synthesizer 60, to which a reference frequency signal fr2 of 8.192 kHz is inputted, generates a signal synchronized with the reference frequency signal and having a frequency of n-fold of the frequency of the reference frequency signal. To this end, the frequency synthesizer 60 is provided with a voltage controlled oscillator (VCO) 62, a variable frequency divider (1/n) 64, a phase comparator (PD) 66, and a low pass filter (LPF) 68. The voltage controlled oscillator 62 performs an oscillation operation at a frequency corresponding to a control voltage Vd. The variable frequency divider 64 frequency-divides the output signal of the voltage controlled oscillator 62 by a variable division ratio n, and outputs the divided signal. The phase comparator 66 compares the phase of the divided signal outputted from the variable frequency divider 64 with the phase of the reference frequency signal fr2, and outputs a pulse signal with a duty corresponding to the phase difference. The low pass filter 68 smoothes the pulse signal outputted from the phase comparator 66, so as to generate the control voltage Vd which is supplied to the voltage controlled oscillator 62. In this way, the frequency synthesizer 60 has a PLL constitution (second PLL circuit), and generates a signal having a frequency of n-fold of the frequency of the reference frequency signal fr2. The division ratio n of the variable frequency divider 64 is set by the control section 90.

The oscillator 72 is connected with the crystal oscillator 70 and oscillates at a natural oscillation frequency of the crystal oscillator 70. In the present embodiment, the crystal oscillator 70 has a natural oscillation frequency lower than 38 kHz.

Specifically, the crystal oscillator 70 which is easily obtained and inexpensive, and which has a natural oscillation frequency of 32.768 kHz, is used. The two frequency dividers 74 and 76 are cascade-connected in the subsequent stage of the oscillator 72. The frequency divider 74 in the preceding stage of the cascade connection, whose division ratio is set to 2, frequency-divides the oscillation signal of 32.768 kHz outputted from the oscillator 72 by the division ratio of 2, and outputs the divided signal. This output signal is inputted to the frequency divider 76 in the subsequent stage and to the clock generating circuit 50 as the reference frequency signal fr1. The frequency divider 76 in the subsequent stage, whose division ratio is set to 2, frequency-divides the output signal of the frequency divider 74 in the preceding stage by the division ratio of 2, and outputs the divided signal. This output signal is inputted to the frequency synthesizer 60 as the reference frequency signal fr2.

The frequency divider 78, whose division ratio is set to K (K is an integer equal to or larger than 1), frequency-divides the output signal of the voltage controlled oscillator 62 in the frequency synthesizer 60 by a division ratio K, and outputs the divided signal. In the present embodiment, the division ratio K is set to 1 for the sake of brevity of description. The three frequency dividers 80, 82, and 84, each division ratio of which is set to 2, generate a signal which has ¼ of the frequency of the output signal of the frequency divider 78 as the first local oscillation signal, and generate a signal, as the second local oscillation signal, which has the same frequency as the first local oscillation signal, and which is different from the first local oscillation signal only in that the phases of the first and second local oscillation signals are 90° out of phase with each other. The frequency divider 80 is used for waveform shaping, and the frequency dividers 82 and 84 are used to generate the first and second local oscillation signals which are 90° out of phase with each other. Further, the frequency divider 80 is provided to enable a signal whose duty ratio is 50% to be surely obtained by the frequency dividers 82 and 84. In the case where the duty ratio of the output signals of the frequency dividers 82 and 84 is not 50%, the effect of removing the image is significantly deteriorated, and hence, such deterioration is prevented by using the frequency divider 80.

Figure 3:
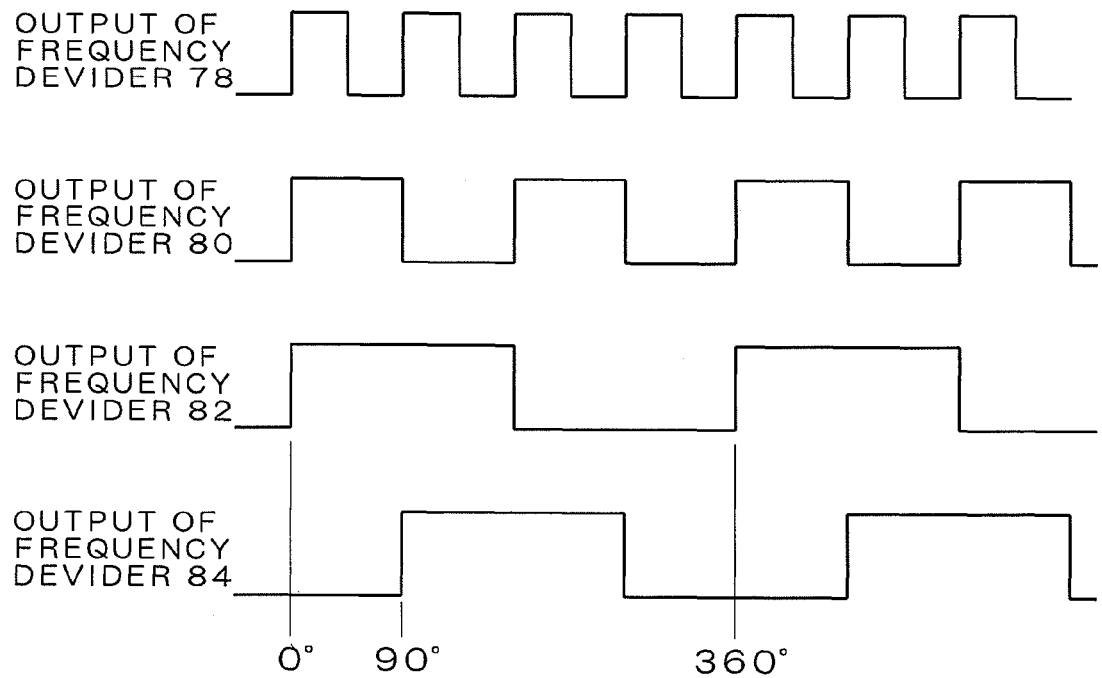
FIG. 3 is a figure showing the operation timing of three frequency dividers.

FIG. 3 is a figure showing the operation timing of three frequency dividers 80, 82, and 84. As shown in FIG. 3, the frequency divider 80 frequency-divides the output signal of the frequency divider 78 designated as "OUTPUT OF FREQUENCY DIVIDER 78" by the division ratio of 2, and outputs the divided signal. Further, the frequency divider 82, which is operated synchronously with the rising timing of the output signal of the frequency divider 80, frequency-divides the output signal by the division ratio of 2, and outputs the divided signal. On the other hand, the frequency divider 84, which is operated synchronously with the falling timing of the output signal of the frequency divider 80, frequency-divides the output signal by the division ratio of 2, and outputs the divided signal. In this way, the first and second local oscillation signals, which have ¼ of the frequency of the output signal of the frequency divider 78, and which are 90° out of phase from each other, are generated.

The control section 90 performs overall control of the FM transmitter. For example, the control section 90 sets the division ratio of the variable frequency divider 64 in the frequency synthesizer 60, and determines the transmission frequency of the FM modulation signal. The operation section 92 is provided with various kinds of switches to be operated by the user. For example, the operation section 92 is provided with a power supply switch, up and down keys which are used to instruct the switching of the transmission frequency, a selection key which is used to selectively instruct a resource to be transmitted (to instruct to transmit either of an analog audio signal or digital audio data), and the like. The display section 94 displays a transmission frequency, operation contents of the operation section 92, a residual quantity of the battery, and the like.

In the present embodiment, respective functions of all the components except the crystal oscillator 70, the antenna 48, the operation section 92, and the display section 94 are integrally formed on a single semiconductor substrate by using a semiconductor process. By making respective functions of all the components except some components such as the crystal oscillator 70, formed as a single chip component by the semiconductor process, it is possible to attain the size reduction, the facilitation of manufacture, and the reduction in power consumption, and the like, in the FM transmitter. These effects are especially made more remarkable by adopting a CMOS process as the semiconductor process.

Figure 4:
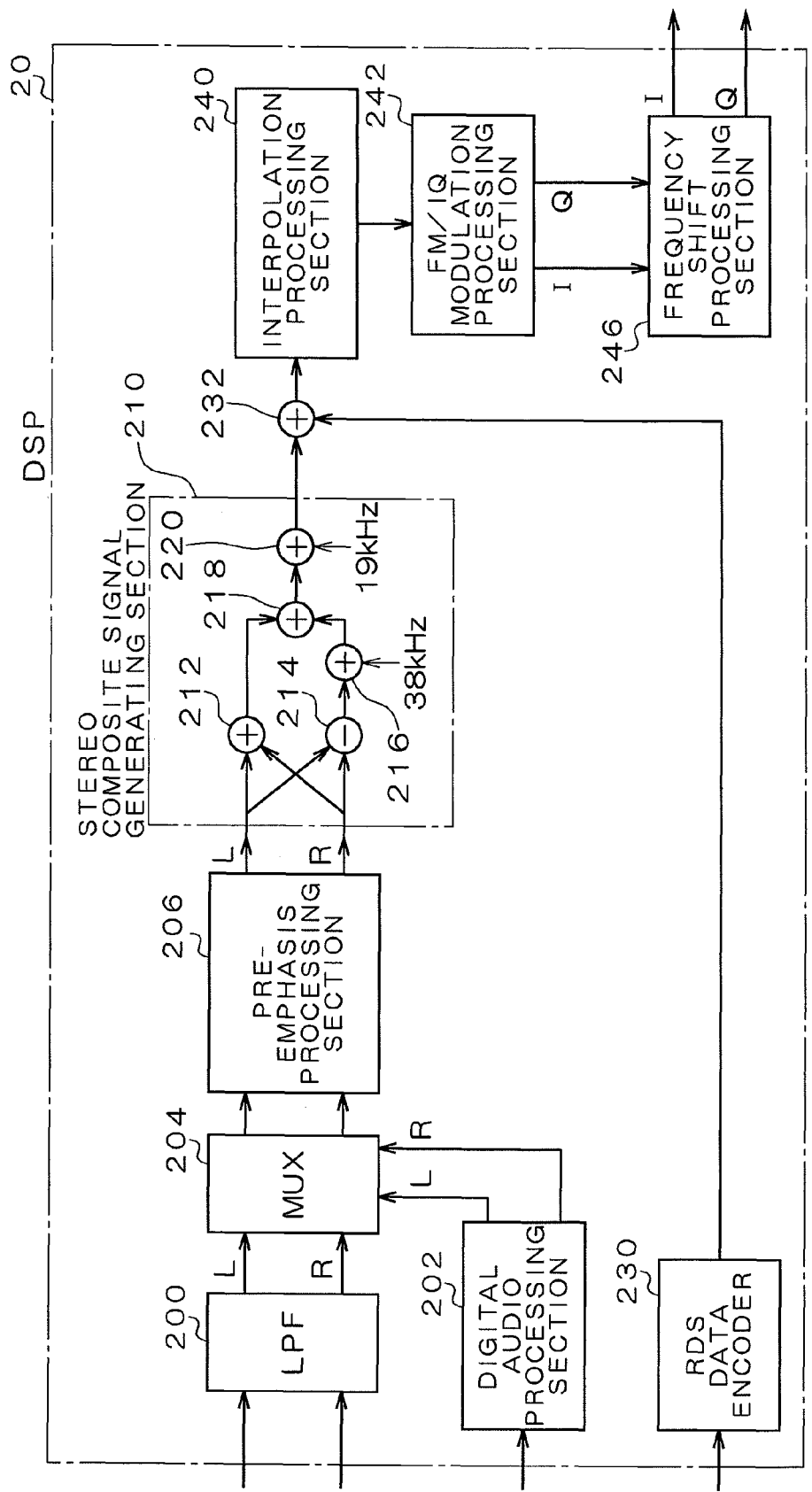
FIG. 4 is a figure showing a detailed constitution of a DSP.

Next, the details of the DSP 20 are described. FIG. 4 is a figure showing a detailed constitution of the DSP 20. As shown in FIG. 4, the DSP 20 is provided with a low pass filter (LPF) 200, a digital audio processing section 202, a multiplexer (MUX) 204, a pre-emphasis processing section 206, a stereo composite signal generating section 210, an RDS (Radio Data System) data encoder 230, an adding section 232, an interpolation processing section 240, an FM/IQ modulation processing section 242 and a frequency shift processing section 246. The functions of each of these constitution elements are realized by the digital processing performed by the DSP 20.

The low pass filter 200 performs band restriction in order to prevent the overmodulation, and removes high-frequency components included in each of the L data and the R data. When receiving the digital audio data with a predetermined format, the digital audio processing section 202 extracts the L data and the R data which are contained in the digital audio data, and changes the sampling rate in the case where the sampling rate of the L data and the R data is different from a rate predetermined for the present embodiment. The multiplexer 204 selects either a set of L data and R data which are inputted via the low pass filter 200, or a set of L data and R data which are outputted from the digital audio processing section 202, and outputs the selected set of L data and R data. Which of the sets of L data and R data is selected is determined by the control section 90 in accordance with the operating state of the selection key of the operation section 92. The pre-emphasis processing section 206 is used in order to enhance the modulation degree of frequency components in the high frequency region.

The stereo composite signal generating section 210 performs a stereo modulating operation to generate a stereo composite signal, and is constituted by including adding sections 212, 216, 218, and 220 and a subtracting section 214. The adding section 212 adds the L data and the R data to generate an (L+R) component. The subtracting section 214 subtracts the R data from the L data to generate an (L−R) component. The adding section 216 adds a subcarrier signal of 38 kHz to the (L−R) component generated by subtracting section 214. The adding section 218 generates a signal including the (L+R) component, the (L−R) component, and the subcarrier signal by further adding the results of the adding operations performed by each of the adding sections 212 and 216. The adding section 220 adds a pilot signal to this signal to generate the stereo composite signal, which is outputted from the stereo composite signal generating section 210.

The RDS data encoder 230 performs predetermined encode processing to character data for RDS, and the like, and generates RDS data. The adding section 232 adds the RDS outputted from the RDS data encoder 230 to the stereo composite signal outputted from the stereo composite signal generating section 210. A stereo composite signal in which the RDS data are superimposed on a predetermined frequency band (in the vicinity of 57 kHz) is generated by this adding processing.

The interpolation processing section 240 performs interpolation processing to the inputted stereo composite signal so as to increase the number of data of the stereo composite signal. For example, 50-fold over-sampling processing to generate 49 data between the two data inputted in order is performed by the interpolation processing. The FM/IQ modulation processing section 242 performs FM modulation processing to the stereo composite signal subjected to the interpolation processing, and extracts an I component and a Q component from the data subjected to the FM modulation processing. When the data subjected to the FM modulation processing is expressed by a complex number, the real part (cosine component) is the I component, and the imaginary part (sine component) is the Q component.

The frequency shift processing section 246 performs a frequency shift (frequency conversion) to the I data and the Q data which are outputted from the FM/IQ modulation processing section 242. This frequency shift processing is performed to prevent the signals from sneaking into the mixers 40 and 42 provided in the subsequent stage of the DSP 20. The FM/IQ modulation processing section 242 outputs frequency-modulated data in the baseband region. When these data are assumed to be directly inputted to the mixers 40 and 42, the mixers 40 and 42 output FM modulated signals having the same frequency as that of the first and second local oscillation signals outputted from each of the frequency dividers 82 and 84. Therefore, the occurrence of the so-called carrier leak that a part of the first and second local oscillation signals sneaks into the output terminal side of the mixers 40 and 42, causes the sneaked components of the first and second local oscillation signals to be included in the frequency band of the transmission signal, which results in a disadvantage that the quality of the transmission signal is deteriorated. According to the present embodiment, in order to avoid such disadvantage, the processing to increase the frequency of data having a frequency in the baseband region is arranged to be performed by the frequency shift processing section 246. When the shifted frequency is set as an offset frequency $f_{offset}$ and the frequency of the first and second local oscillation signals is set as $f_{LO}$, the frequency fo of the output signals of the mixers 40 and 42 are obtained as $(f_{LO}-f_{offset})$ or $(f_{LO}+f_{offset})$. Thereby, it is possible to prevent the carrier leak that the local oscillation signals leak into the frequency band of the transmission signal outputted from the mixers 40 and 42, by setting the offset frequency $f_{offset}$ to a suitable value.

The frequency synthesizer 60 and the frequency dividers 78, 80, 82, and 84, as described above, correspond to the carrier wave generating circuit, the frequency divider 54 to the first frequency divider, the variable frequency divider 64 to the second frequency divider, the frequency dividers 78, 80, 82, and 84 to the third frequency divider, and the mixers 40 and 42, the adder 44, and the amplifier 46 to the transmitting circuit, respectively.

The features of the FM transmitter according to the present embodiment are listed as follows.

(1) The clock signal of high frequency (40.321 MHz in the example shown in FIG. 1) is generated by using the clock generating circuit 50, and stereo modulation processing is performed by digital processing performed by the DSP 20, so that it is not necessary to generate the signal of 38 kHz as the subcarrier or the signal of 19 kHz as the pilot signal. This makes it possible to increase the degree of freedom in parts (crystal oscillator) selection.

(2) The output signal of the oscillator 72 with a low oscillation frequency is frequency-divided by the two frequency dividers 74 and 76, so that the reference frequency signal fr2 having a further lower frequency of 8.192 kHz is generated. The frequency of 8.192 kHz is sufficiently low in comparison with the assigned frequency interval (100 kHz) of FM broadcast waves, so that it is possible to reduce an error between the desired frequency (frequency that can be received by an FM receiver) and the frequency of the actual FM transmission signal.

(3) The use of the IQ modulation system makes it possible to reduce the image included in the FM transmission signal.

(4) The crystal oscillator 70 having the natural oscillation frequency of 32.768 kHz is commercially available for a timepiece at a low cost and is easily obtained, which makes it possible to reduce component costs.

(5) The output signal of the frequency synthesizer 60 is frequency-divided by a division ratio of L (=4K) by using the frequency dividers 78, 80, 82, and 84, so as to generate the first and second local oscillation signals. This makes it possible to switch the oscillation frequency of the frequency synthesizer 60 at the frequency interval of 4K-fold of 100 kHz which is the assigned frequency interval of FM broadcast waves. For this reason, when the reference frequency signal fr2 of 8.192 kHz which is not coincident with the assigned frequency interval or an integer fraction of the frequency interval, is used, it is possible to further reduce the error between the desired frequency (frequency that can be received by the FM receiver) and the frequency of the actual FM transmission signal. That is, as described in (2), the output signal of the oscillator 72 is frequency-divided by the two frequency dividers 74 and 76, so as to generate the reference frequency signal fr2. This makes it possible to reduce the above described error, but this effect is made more remarkable by frequency-dividing the output signal of the frequency synthesizer 60 with the frequency dividers 78, 80, 82, and 84. For example, in the case of K=1, the maximum error becomes a half of the frequency of 8.192 kHz of the reference frequency signal fr2, but the error can be reduced to ¼(1.024 kHz) of the maximum error by making the output signal of the frequency synthesizer 60 pass through the frequency divider 80, and the like.

Meanwhile, as the reference frequency signal of the PLL frequency synthesizer, a frequency of an integer fraction of the assigned frequency interval (100 kHz in the case of Japan) of FM broadcast waves is generally selected. However, in the case where the reference frequency signal whose frequency is not an integer fraction of the assigned frequency interval of FM broadcast waves is used as in the present embodiment, a method is generally adopted in which the deviation between the frequency of the actual output signal of the PLL frequency synthesizer and the frequency of the signal desired to be transmitted is reduced by making the frequency of the reference frequency signal as low as possible by using a frequency divider.

However, when the frequency of the reference frequency signal is lowered, the loop gain of the PLL circuit constituting the frequency synthesizer is reduced, which results in disadvantages that the CN ratio (ratio between the carrier level and the noise level) in the vicinity of the carrier wave frequency of FM broadcast waves is deteriorated, and that the lock time of the PLL circuit is also prolonged. Further, the time constant of the low pass filter in the PLL circuit is increased, which makes it difficult to form all the components of the frequency synthesizer on a semiconductor substrate. On the other hand, as in the present embodiment, in the case where the method of frequency-dividing the output signal of the oscillator 72 to generate the reference frequency signal fr2 is used in combination with the method of frequency-dividing the output signal of the frequency synthesizer 60, it is possible to avoid the above described disadvantages, and to reduce the deviation (error of oscillation frequency) between the frequency of the local oscillation signal generated by using the frequency synthesizer 60 and the frequency of the signal desired to be transmitted. Note that, although in the case where the reference frequency signal fr2 of 8.192 kHz is used, the characteristics including the loop gain of the PLL circuit, the CN ratio in the vicinity of the carrier wave frequency of FM broadcast waves, and the lock time of the PLL circuit, are not significantly deteriorated, but it is possible to further improve these characteristics by using the above two methods in combination together.

The error of oscillation frequency is explained by using specific numerical values, as follows. The frequency of the reference frequency signal fr2 inputted to the frequency synthesizer 60 from the oscillator 72 is set to Fr (=8.192 kHz). Further, when the oscillation frequency of the voltage controlled oscillator 62 in the frequency synthesizer 60 is set to $F_{osc}$, and the frequency of the actual FM modulation signal transmitted from the amplifier 46 via the antenna 48 is set to Ftx, the equation:

$$Ftx = Fr \times n/(4K)$$

is obtained, where n is a division ratio of the variable frequency divider 64, and 4K is a division ratio of the frequency dividers 78, 80, 82 and 84 as a whole.

In the case where the frequency dividers 78, 80, 82, and 84 are not provided (in the case of 4K=1), n is required to be set as n=Ftx/Fr=10986.328 in order to obtain Ftx=90.00 MHz. The actual value of n is an integer value, and hence, when the decimal places of n are rounded off, n is obtained as n=10986. The frequency of 0.328×8.192 kHz=2.687 kHz corresponding to the fraction component (0.328) in this case becomes the frequency error of the FM modulation signal desired to be transmitted. On the other hand, in the case where the frequency dividers 78, 80, 82, and 84 are included, n is obtained as n=4K×Ftx/Fr=43945.312, assuming that k=1. When the decimal places of n are rounded off, n is obtained as n=43945. In this case, the frequency of 0.639 kHz corresponding to the fraction component (0.312) becomes the frequency error of the FM modulation signal desired to be transmitted. In this way, the error in the transmission frequency can be reduced by inserting the frequency dividers 78, 80, 82, and 84 in the subsequent stage of the frequency synthesizer 60.

Note that the present invention is not limited to the above described embodiment, and various modifications and variations are possible within the scope and spirit of the present invention. For example, the FM modulation processing and the IQ modulation processing are performed in the DSP 20 in the above described embodiment, but only the generation of the stereo composite signal may be arranged to be performed in the DSP so as to make the FM modulation processing performed in a constitution arranged in the subsequent stage of the DSP.

Figure 5:
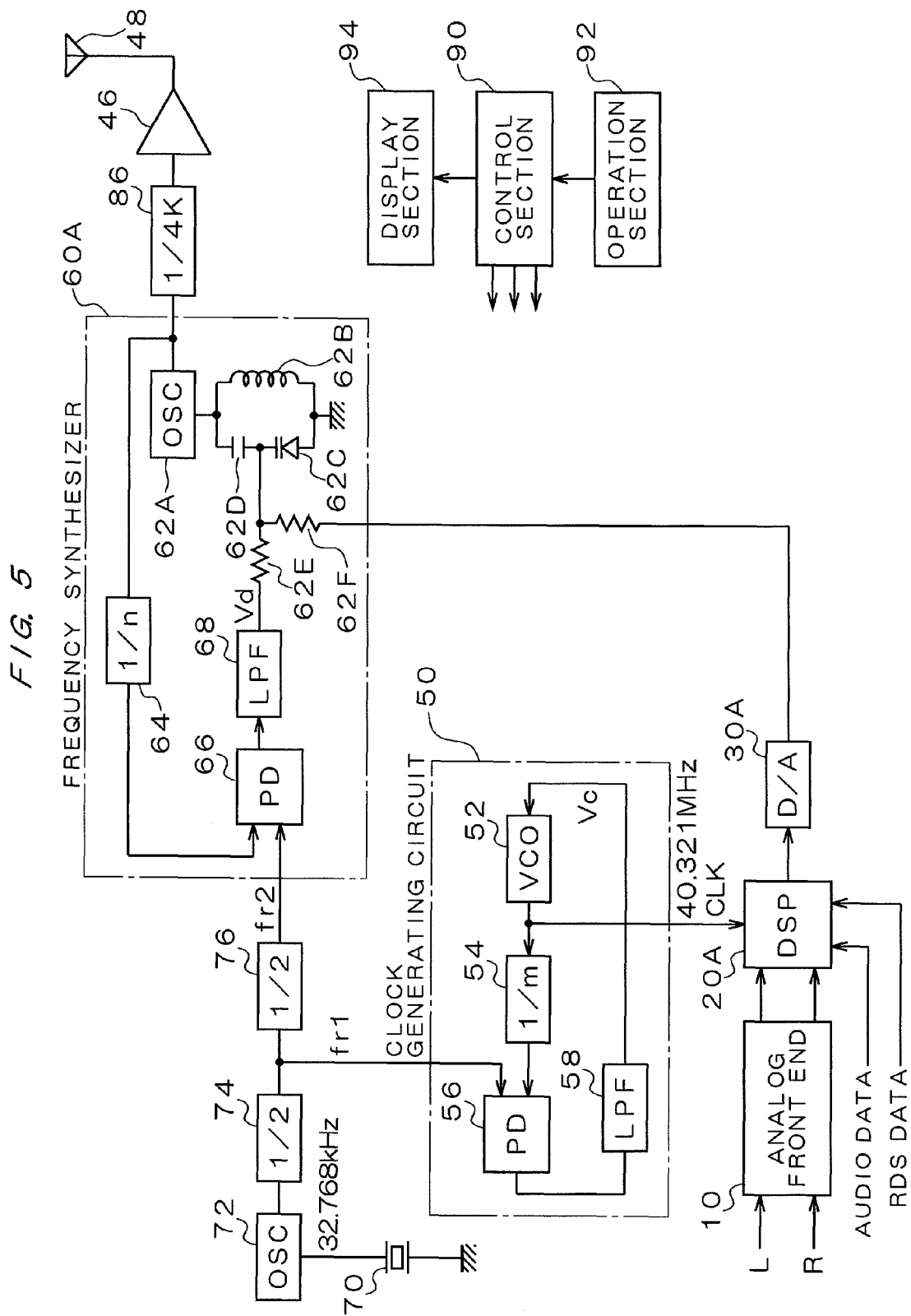
FIG. 5 is a figure showing a modification of the FM transmitter which is arranged to perform FM modulation processing by changing a resonance frequency of a resonance circuit included in a voltage controlled oscillator.

FIG. 5 is a figure showing a modification of the FM transmitter arranged such that the resonance frequency of the resonance circuit included in the voltage controlled oscillator can be changed so as to enable the FM modulation processing to be performed. The FM transmitter shown in FIG. 5 is provided with an analog front end 10 and a DSP 20A, a digital-analog converter 30A, an amplifier 46, an antenna 48, a clock generating circuit 50, a frequency synthesizer 60A, a crystal oscillator 70, an oscillator (OSC) 72, frequency dividers 74, 76, and 86, a control section 90, an operation section 92, and a display section 94. In this FM transmitter, a constitution element that performs the same function as that of each element shown in FIG. 1 is designated by the same reference numeral or the same reference character. Thus, the following description will be made mainly in view of the constitution elements having functions different from those shown in FIG. 1.

Figure 6:
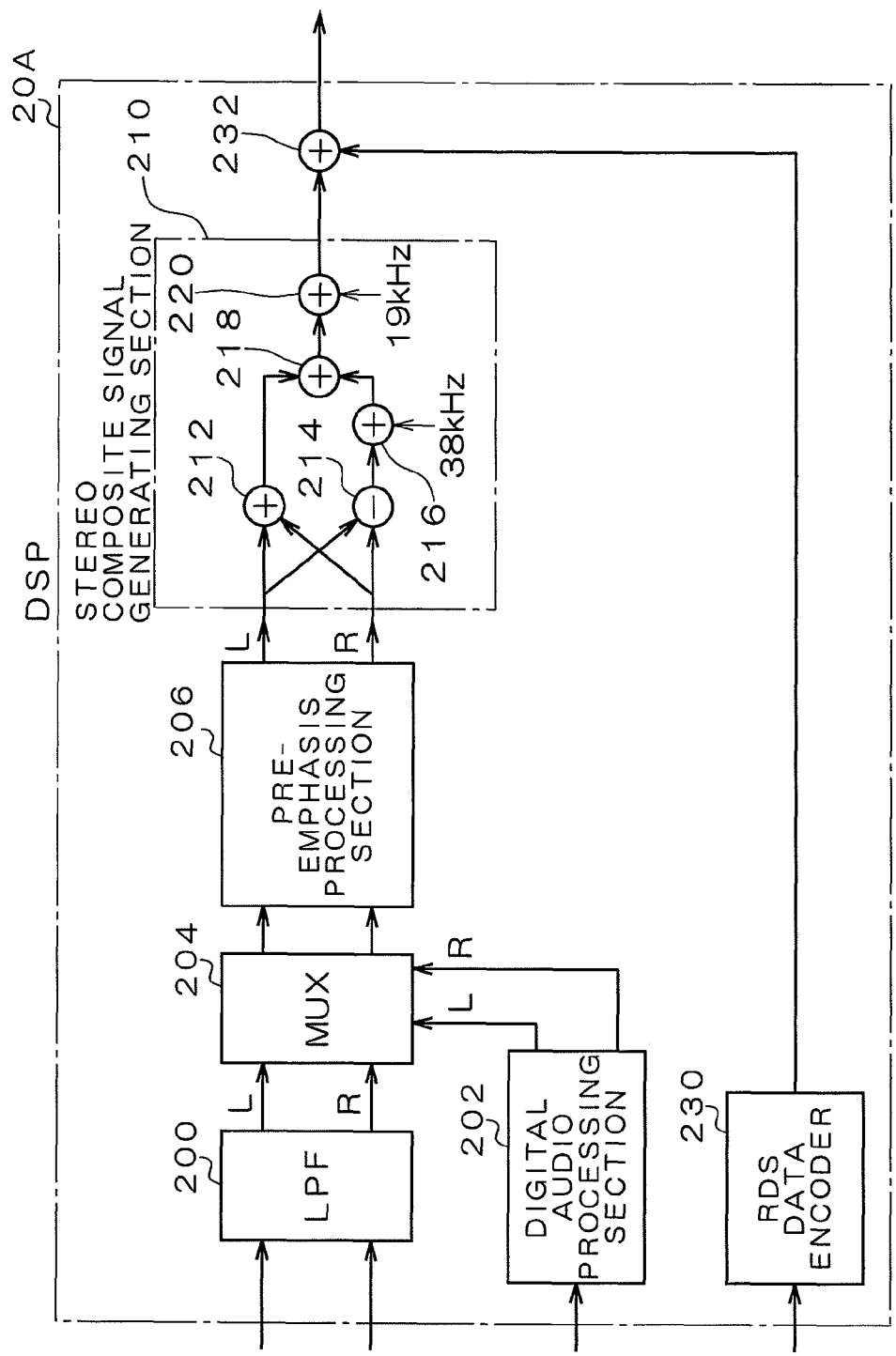
FIG. 6 is a figure showing a detailed constitution of the DSP included in the FM transmitter shown in FIG. 5.

FIG. 6 is a figure showing a detailed constitution of the DSP 20A included in the FM transmitter shown in FIG. 5. The DSP 20A performs stereo modulation processing on the basis of the L data and the R data which are outputted from the analog front end 10. As shown in FIG. 6, the DSP 20A is provided with a low pass filter (LPF) 200, a digital audio processing section 202, a multiplexer (MUX) 204, a pre-emphasis processing section 206, a stereo composite signal generating section 210, and an adding section 232. The functions of respective constitution elements are realized by the digital processing performed by the DSP 20A. The DSP 20A has a constitution in which the interpolation processing section 240, the FM/IQ modulation processing section 242, and the frequency shift processing section 246 are omitted in the DSP 20 shown in FIG. 4. That is, in the DSP 20A, a stereo composite signal outputted from the stereo composite signal generating section 210 is directly outputted. The stereo composite signal (digital data) outputted from the DSP 20A is converted into an analog signal by the digital-analog converter 30A so as to be inputted to the frequency synthesizer 60A.

The frequency synthesizer 60A, to which a reference frequency signal fr2 is inputted, generates a signal synchronized with the reference frequency signal and having a frequency of n-fold of the frequency of the reference frequency signal. To this end, the frequency synthesizer 60 is provided with an oscillator (OSC) 62A, an inductor 62B, a variable capacitance diode 62C, a capacitor 62D, resistors 62E and 62F, a variable frequency divider (1/n) 64, a phase comparator (PD) 66, and a low pass filter (LPF) 68. The oscillator 62A constitutes a voltage controlled oscillator along with a parallel resonant circuit which consists of the inductor 62B, the variable capacitance diode 62C, and the capacitor 62D. The output terminal of the low pass filter 68 is connected via the resistor 62E to a point connecting the variable capacitance diode 62C with the capacitor 62D. Thus, the resonance frequency of the parallel resonant circuit is determined in accordance with a control voltage Vd outputted from the low pass filter 68, thereby making the oscillator 62A oscillate at this frequency. Further, the output terminal of the digital-analog converter 30A is connected via the resistor 62F to the point connecting the variable capacitance diode 62C with the capacitor 62D. The stereo composite signal is outputted from the digital-analog converter 30A, so that when the potential at the point connecting the variable capacitance diode 62C with the capacitor 62D is changed in accordance with the amplitude of the stereo composite signal, the oscillation frequency of the oscillator 62A is also changed. In this way, the FM modulating operation is performed to the stereo composite signal.

The frequency divider 86 frequency-divides the oscillation signal of the oscillator 62A in the frequency synthesizer 60A by a division ratio of 4K=L, and outputs the frequency-divided signal. The output signal (FM modulation signal) of the frequency divider 86 is amplified by the amplifier 46, and then transmitted from the antenna 48.

In this way, the stereo composite signal may be arranged to be generated by the DSP 20A, so as to make the oscillation frequency of the oscillator 62A in the frequency synthesizer 60A changed in accordance with the amplitude of the stereo composite signal, and to thereby enable the FM modulation to be performed. By adopting the so-called direct modulation system which changes the carrier wave frequency, it is possible to transmit the FM modulation signal with a simple constitution.

Further, in the above described embodiment, the crystal oscillator 70 having a natural oscillation frequency of 32.768 kHz is used, but it is conceivable that the natural oscillation frequency of the crystal oscillator 70 can be variously modified in relation to the reference frequency signals fr1, fr2, or the assigned frequency interval of FM broadcast waves. In consideration of these modifications, the relationship between each kind of the frequencies within the scope of the present invention is described as follows.

(1) The case where the frequency of the reference frequency signal fr2 is not coincident with the assigned frequency interval of FM broadcast waves, or an integer fraction of this assigned frequency interval The assigned frequency interval of FM broadcast waves is 100 kHz. However, when it is considered that the frequency dividers 78, 80, 82, and 84, the division ratio of which is "4K" as a whole, are connected to the output side of the frequency synthesizer 60, the interval of the oscillation frequency required of the frequency synthesizer 60 is (4K×100) kHz. Therefore, the case of (1) means the case where the frequency of the reference frequency signal fr2 is not coincident with (4K×100) kHz, or an integer fraction of (4K×100) kHz. The frequency dividers 74 and 76, (the division ratio of which is 4 as a whole), are connected to the subsequent stage of the oscillator 72. Eventually, the case of (1) means the case where the natural oscillation frequency of the crystal oscillator 70 is not coincident with (4×4K×100) kHz, or an integer fraction of (4×4K×100) kHz. For example, in the case where K=1, the crystal oscillator 70 having a natural oscillation frequency which is not coincident with 1600 kHz or with an integer fraction of 1600 kHz, is used. The natural oscillation frequency (32.768 kHz) of the crystal oscillator 70 shown in FIG. 1 can be applied to the case of (1). Note that it is possible to omit the frequency divider 86 in the constitution shown in FIG. 5. In this case, it becomes that 4K=1, and hence, the crystal oscillator 70 having the natural oscillation frequency which is not coincident with 400 kHz or an integer fraction of 400 kHz, is used.

Further, in the present embodiment, the stereo modulating operation is performed by the digital processing performed by the DSP 20, so that the conventionally used signals of 19 kHz and 38 kHz are not necessary. This makes it possible to add, as a condition of the natural oscillation frequency of the crystal oscillator 70, a condition that the natural oscillation frequency is not coincident with an integer multiple of 19 kHz. In other words, when the natural oscillation frequency of the crystal oscillator 70 is set (selected), the condition to select an integer multiple of 19 kHz is not required. This makes it possible to further relax the frequency condition required of an available crystal oscillator, and to thereby improve the degree of freedom in parts selection.

(2) The case where the reference frequency signal fr2 is coincident with the assigned frequency interval of FM broadcast waves, or an integer fraction of this assigned frequency interval Contrary to the case of (1) as described above, the reference frequency signal fr2 may be arranged to be coincident with the assigned frequency interval of FM broadcast waves, or an integer fraction of the assigned frequency interval. That is, the natural oscillation frequency of the crystal oscillator 70 may be arranged to be coincident with (4×4K×100) kHz or an integer fraction of (4×4K×100) kHz. This makes it possible to generate and transmit an FM modulation signal without a frequency error in the frequency that can be received by the FM receiver. As a result, it is possible to improve the reception quality at the time when the FM modulation signal is received by the FM receiver.

Further, in the above described embodiment, the oscillator 72 connected with the crystal oscillator 70 is used, but instead of the crystal oscillator 70 and the oscillator 72, or instead of the constitution further including the frequency dividers 74 and 76 in addition to the crystal oscillator 70 and the oscillator 72, an external circuit (not shown) may be arranged to be connected, so as to make a signal supplied from the external circuit inputted to the clock generating circuit 50 and to the frequency synthesizer 60 as the reference frequency signals fr1 and fr2. In such a case where the FM transmitter and the FM receiver, and the like are integrally formed as one chip component it is possible to omit the crystal oscillator 70 and the oscillator 72, and the like which are exclusively used for the FM transmitter, by using the signal generated by a part (external circuit) of the FM receiver, and the like, and to thereby simplify the constitution.

Further, in the above described embodiment, the signal formed by frequency-dividing the output signal of the oscillator 72 by the frequency divider 74 is inputted to the clock generating circuit 50 as the first reference frequency signal fr1, and the signal formed by frequency-dividing the output signal of the oscillator 72 by the frequency dividers 74 and 76 is inputted to the frequency synthesizers 60 and 60A as the second reference frequency signal fr2. However, the output signal of the oscillator 72 may be used as one of the first and second reference frequency signals fr1 and fr2, without making the output signal pass through the frequency divider.

What is claimed is:
1. An FM transmitter comprising:
an oscillator connected with a crystal oscillator;
a clock generating circuit which generates a clock signal synchronized with a signal formed by frequency-dividing an output signal of the oscillator;
a digital signal processor to which the clock signal generated by the clock generating circuit is inputted as an operating clock, and which performs a stereo modulating operation to stereo data by digital processing; and
a carrier wave generating circuit to which a signal formed by frequency-dividing the output signal of the oscillator is inputted, and which generates a carrier wave synchronized with the inputted signal and having a frequency of an integer multiple of the frequency of the inputted signal,
the FM transmitter transmitting an FM modulation signal formed by frequency-modulating a stereo composite signal obtained by the stereo modulating operation performed by the digital signal processor.

2. The FM transmitter according to claim 1, wherein the clock generating circuit is a first PLL circuit to which a signal formed by frequency-dividing the output signal of the oscillator is inputted as a first reference frequency signal fr1, and
wherein the clock signal having a frequency of m-fold of the frequency of the first reference frequency signal fr1 is generated when a division ratio of a first divider included in the first PLL circuit is set to an integer m.

3. The FM transmitter according to claim 2, wherein the second PLL circuit is a frequency synthesizer in which the division ratio n of the second frequency divider can be changed, further comprising a control section which variably sets, by changing the division ratio n, a frequency of an output signal of the second PLL circuit at an assigned frequency interval of FM broadcast waves or at an integer fraction of the assigned frequency interval.

4. The FM transmitter according to claim 2, wherein the carrier wave generating circuit is a second PLL circuit to which a signal formed by frequency-dividing the output signal of the oscillator is inputted as a second reference frequency signal fr2, and
wherein the carrier wave having a frequency of n-fold of the frequency of the second reference frequency signal fr2 is generated when a division ratio of a second divider included in the second PLL circuit is set to an integer n.

5. The FM transmitter according to claim 4, wherein the carrier wave generating circuit outputs, as the carrier wave, a signal formed by frequency-dividing a signal generated by the second PLL circuit, by a third frequency divider with a division ratio L.

6. The FM transmitter according to claim 5, wherein the second PLL circuit is a frequency synthesizer in which the division ratio n of the second frequency divider can be changed,
further comprising a control section which variably set, by changing the division ratio n, a frequency of an output signal of the second PLL circuit at an assigned frequency interval of FM broadcast waves or at a frequency interval set by multiplying an integer fraction of the assigned frequency interval by the division ratio L of the third frequency divider.

7. The FM transmitter according to claim 5, wherein the frequency of the second reference frequency signal fr2 is not coincident with an assigned frequency interval of FM broadcast waves or a frequency set by multiplying an integer fraction of the assigned frequency interval by the division ratio L of the third frequency divider, and is not coincident with an integer multiple of 19 kHz.

8. The FM transmitter according to claim 5, wherein the frequency of the second reference frequency signal fr2 is coincident with an assigned frequency interval of FM broadcast waves or a frequency set by multiplying an integer fraction of the assigned frequency interval by the division ratio L of the third frequency divider.

9. The FM transmitter according to claim 8, wherein the carrier wave generating circuit generates two kinds of the carrier waves which are 90° out of phase from each other,
further comprising a transmitting circuit having two mixers which independently mix signals, each corresponding to each of an I component and a Q component that are extracted by the digital signal processor, with the two kinds of carrier waves that are generated by the carrier wave generating circuit, respectively, an adder which adds the two kinds of signals mixed by the two mixers, and an amplifier which amplifies an output signal of the adder and transmits the amplified signal from an antenna.

10. The FM transmitter according to claim 4, wherein the frequency of the second reference frequency signal fr2 is not coincident with an assigned frequency interval of FM broadcast waves or an integer fraction of the assigned frequency interval.

11. The FM transmitter according to claim 10, wherein the crystal oscillator has a natural oscillation frequency of 32.768 kHz.

12. The FM transmitter according to claim 4, wherein the frequency of the second reference frequency signal fr2 is not coincident with an assigned frequency interval of FM broadcast waves or an integer fraction of the assigned frequency interval, and is not coincident with an integer multiple of 19 kHz.

13. The FM transmitter according to claim 1, wherein respective functions of the oscillator except the crystal oscillator, the clock generating circuit, the digital signal processor, and the carrier wave generating circuit are formed on one semiconductor substrate by using a semiconductor process.

14. The FM transmitter according to claim 13, wherein the second PLL circuit has an oscillator whose oscillation frequency is changed in accordance with an amplitude of the stereo composite signal obtained by the stereo modulating operation performed by the digital signal processor.

15. The FM transmitter according to claim 13, wherein the semiconductor process is a CMOS process.

16. The FM transmitter according to claim 1, wherein a frequency of a second reference frequency signal fr2 is coincident with an assigned frequency interval of FM broadcast waves or an integer fraction of the assigned frequency interval.

17. The FM transmitter according to claim 1, wherein the digital signal processor performs an FM modulating operation to the stereo composite signal obtained by the stereo modulating operation, and performs an IQ modulating operation which extracts an I component and a Q component from the signal subjected to the FM modulating operation.

18. The FM transmitter according to claim 1, wherein an external circuit is connected, instead of the oscillator connected with the crystal oscillator, and
wherein a signal supplied from the external circuit is used, instead of the output signal of the oscillator connected with the crystal oscillator.

19. The FM transmitter according to claim 1, wherein the crystal oscillator has a natural oscillation frequency lower than 38 kHz.

20. An FM transmitter comprising:
an oscillator connected with a crystal oscillator;
a clock generating circuit which generates a clock signal synchronized with a signal formed by frequency-dividing an output signal of the oscillator;
a digital signal processor to which the clock signal generated by the clock generating circuit is inputted as an operating clock, and which performs a stereo modulating operation to stereo data by digital processing; and
a carrier wave generating circuit to which the output signal of the oscillator is directly inputted, and which generates a carrier wave that is synchronized with the output signal and that has a frequency of an integer multiple of the frequency of the output signal,
the FM transmitter transmitting an FM modulation signal formed by frequency-modulating a stereo composite signal obtained by the stereo modulating operation performed by the digital signal processor.

21. The FM transmitter according to claim 20, wherein the clock generating circuit is a first PLL circuit to which a signal formed by frequency-dividing the output signal of the oscillator is inputted as a first reference frequency signal fr1, and
wherein the clock signal having a frequency of m-fold of the frequency of the first reference frequency signal fr1 is generated when a division ratio of a first divider included in the first PLL circuit is set to an integer m.

22. The FM transmitter according to claim 21, wherein the carrier wave generating circuit is a second PLL circuit to which the output signal of the oscillator is inputted as a second reference frequency signal fr2, and
wherein the carrier wave having a frequency of n-fold of the frequency of the second reference frequency signal fr2 is generated when a division ratio of a second divider included in the second PLL circuit is set to an integer n.

23. An FM transmitter comprising:
an oscillator connected with a crystal oscillator;
a clock generating circuit which generates a clock signal synchronized with an output signal of the oscillator;
a digital signal processor to which the clock signal generated by the clock generating circuit is inputted as an operating clock, and which performs a stereo modulating operation to stereo data by digital processing; and
a carrier wave generating circuit to which a signal formed by frequency-dividing the output signal of the oscillator is inputted, and which generates a carrier wave synchronized with the inputted signal and having a frequency of an integer multiple of the frequency of the inputted signal,
the FM transmitter transmitting an FM modulation signal formed by frequency-modulating a stereo composite signal obtained by the stereo modulating operation performed by the digital signal processor.

24. The FM transmitter according to claim 23, wherein the clock generating circuit is a first PLL circuit to which the output signal of the oscillator is inputted as a first reference frequency signal fr1, and
wherein the clock signal having a frequency of m-fold of the frequency of the first reference frequency signal fr1 is generated when a division ratio of a first divider included in the first PLL circuit is set to an integer m.

25. The FM transmitter according to claim 24, wherein the carrier wave generating circuit is a second PLL circuit to which a signal formed by frequency-dividing the output signal of the oscillator is inputted as a second reference frequency signal fr2, and
wherein the carrier wave having a frequency of n-fold of the frequency of the second reference frequency signal fr2 is generated when a division ratio of a second divider included in the second PLL circuit is set to an integer n.

* * * * *